United States Patent
Wang

(10) Patent No.: US 10,084,474 B1
(45) Date of Patent: Sep. 25, 2018

(54) NOISE SHAPING CIRCUIT AND SIGMA-DELTA DIGITAL-TO-ANALOG CONVERTER

(71) Applicant: Shenzhen Goodix Technology Co., Ltd., Shenzhen, Guangdong (CN)

(72) Inventor: Wen-Chi Wang, Taipei (TW)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/822,190

(22) Filed: Nov. 26, 2017

Related U.S. Application Data

(63) Continuation of application No. PCT/CN2017/088388, filed on Jun. 15, 2017.

(51) Int. Cl.
  *H03M 3/00* (2006.01)

(52) U.S. Cl.
  CPC ............ *H03M 3/50* (2013.01); *H03M 3/416* (2013.01); *H03M 3/438* (2013.01)

(58) Field of Classification Search
  CPC ........ H03M 3/50; H03M 3/416; H03M 3/438; H03M 3/30; H03M 7/3022
  USPC .............................................. 341/143, 76–77
  See application file for complete search history.

(56) References Cited

U.S. PATENT DOCUMENTS

| | | | | |
|---|---|---|---|---|
| 5,369,403 A * | 11/1994 | Temes | ................. | H03M 7/3022 341/143 |
| 7,345,606 B2 * | 3/2008 | Reefman | ................. | H03M 3/50 341/143 |
| 8,031,096 B2 * | 10/2011 | Kinyua | ................. | H03M 3/50 341/143 |
| 8,325,074 B2 * | 12/2012 | Kinyua | ............... | H03M 7/3022 341/143 |
| 8,952,837 B2 * | 2/2015 | Kim | ........................ | H03M 3/32 341/143 |
| 9,166,615 B2 * | 10/2015 | Kinyua | ................. | H03M 1/747 |
| 2002/0171572 A1 | 11/2002 | Yamamoto | | |

FOREIGN PATENT DOCUMENTS

CN          204559547 U       8/2015

OTHER PUBLICATIONS

Shao-Wei Huang, A High-Performance Audio Σ-Δ Digital-to-Analog Converter, China Doctoral Dissertation Full-text Database Information Technology Series, Jun. 2009, p. 16-19, p. 41-43, China.

* cited by examiner

Primary Examiner — Khai M Nguyen
(74) Attorney, Agent, or Firm — Winston Hsu

(57) ABSTRACT

The present application provides a noise shaping circuit including a first modulation unit, configured to generate a first digital output signal according to a first digital input signal, the first modulation unit comprising a first quantizer; a first subtractor, coupled to an input terminal and an output terminal of the first quantizer, configured to generate a first quantization noise; and a second modulation unit, configured to generated a second digital output signal according to a second digital input signal, wherein the second digital input signal is related to the first quantization noise; wherein the noise shaping circuit generates an overall analog output signal according to the first digital output signal and the second digital output signal.

8 Claims, 5 Drawing Sheets

NOISE SHAPING CIRCUIT AND SIGMA-DELTA DIGITAL-TO-ANALOG CONVERTER

CROSS REFERENCE TO RELATED APPLICATIONS

The present application is a continuation of international application No. PCT/CN2017/088388, filed on Jun. 15, 2017, of which are incorporated herein by reference in its entirety.

FIELD OF THE INVENTION

The present application relates to a noise shaping circuit and a sigma-delta digital-to-analog convertor (DAC), and more particularly, to a noise shaping circuit and a sigma-delta DAC capable of lowering noise energy.

BACKGROUND

Oversampling sigma-delta (ΣΔ) modulator is suitable for high resolution analog-to-digital convertor (ADC) or digital-to-analog convertor (DAC). For example, the sigma-delta DAC comprises an upsampling circuit, a filter, a quantizer, a digital-to-analog convertor and a low pass filter (LPF).

In order to increase the resolution of the sigma-delta DAC, it can be achieved by increasing the oversampling rate, increasing the order of filter, or even increasing the number of bits within the quantizer. Higher oversampling rate has a drawback of consuming more power. Higher filter order would cause energy of the out-of-band noise to be larger, and increase the cost of the backend analog low pass filter. In addition, even though more number of bits within the quantizer would reduce the out-of-band noise, however, under a condition of limited number of quantization bits, energy of the out-of-band noise is still high. Hence, the LPF with specific corner frequency is required to filter out the out-of-band noise.

The LPF is composed of an operational amplifier, resistor(s) and capacitor(s). Since noise is proportional to the resistance in the LPF, to achieve high signal-to-noise ratio (SNR), the resistance of the resistor is required to be small. However, to maintain the corner frequency of the LPF, the LPF needs the capacitor with large capacitance, which requires too large circuit area.

Therefore, it is necessary to improve the prior art.

SUMMARY

It is therefore a primary objective of the present application to provide a noise shaping circuit and a sigma-delta DAC capable of lowering noise energy, to improve over disadvantages of the prior art.

To solve the problem stated in the above, the present application provides a noise shaping circuit comprising a first modulation unit configured to generate a first digital output signal according to a first digital input signal, where the first modulation unit comprising a first filter, having a first transfer function; and a first quantizer coupled to the first filter; a first subtractor coupled to an input terminal and an output terminal of the first quantizer, configured to generate a first quantization noise; and a second modulation unit, configured to generated a second digital output signal according to a second digital input signal, wherein the second digital input signal is related to the first quantization noise, the second modulation unit comprises the second filter having a second transfer function; and the second quantizer coupled to the second filter; wherein the noise shaping circuit generates an overall analog output signal according to the first digital output signal and the second digital output signal.

Preferably, the noise shaping circuit comprises a third filter, having a third transfer function, coupled to the second modulation unit, configured to generate a filter result; wherein the noise shaping circuit generates the overall analog output signal according to the first digital output signal and the filter result.

Preferably, the noise shaping circuit comprises a fourth filter, having a fourth transfer function, coupled between the first subtractor and the second modulation unit, configured to generate the second digital input signal according to the first quantization noise.

Preferably, the fourth transfer function is related to the first transfer function and the third transfer function.

Preferably, the fourth transfer function is related to a reciprocal of the third transfer function.

Preferably, the third filter has a direct current (DC) gain, and the DC gain is less than 1.

Preferably, the third filter is a high pass filter.

Preferably, the third filter comprises an operational amplifier, comprising a first input terminal and an output terminal; a first resistor, coupled between the first input terminal and the output terminal of the operational amplifier, corresponding to a first resistance; a capacitor; and a second resistor, corresponding to a second resistance; wherein the capacitor and the second resistor are coupled between the first input terminal of the operational amplifier and the second modulation unit, the second resistance is the first resistance times a number, and the number is a reciprocal of the DC gain of the third filter.

Preferably, the noise shaping circuit comprises a first digital-to-analog convertor (DAC), coupled to the first modulation unit, configured to convert the first digital output signal as a first analog output signal; and a second DAC, coupled between the second modulation unit and the third filter, configured to convert the second digital output signal as a second analog output signal; wherein the third filter generates the filter result according to the second analog output signal; wherein the noise shaping circuit outputs the overall analog output signal as a summation of the first analog output signal and the filter result.

Preferably, a first filter order of the first filter is larger than or equal to a second filter order of the second filter.

The present application further provides a sigma-delta digital-to-analog convertor, comprising an upsampling circuit, configured to generate a first digital input signal; and a noise shaping circuit comprising a first modulation unit configured to generate a first digital output signal according to a first digital input signal, where the first modulation unit comprising a first filter, having a first transfer function; and a first quantizer coupled to the first filter; a first subtractor coupled to an input terminal and an output terminal of the first quantizer, configured to generate a first quantization noise; and a second modulation unit, configured to generated a second digital output signal according to a second digital input signal, wherein the second digital input signal is related to the first quantization noise, the second modulation unit comprises the second filter having a second transfer function; and the second quantizer coupled to the second filter; wherein the noise shaping circuit generates an overall analog output signal according to the first digital output signal and the second digital output signal.

The present application utilizes the two modulation units and the analog high pass filter to form the shaped noise spectrum with various slopes, and has advantage of being able to lower the noise spectrum, increase SNR and reduce circuit area.

These and other objectives of the present application will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
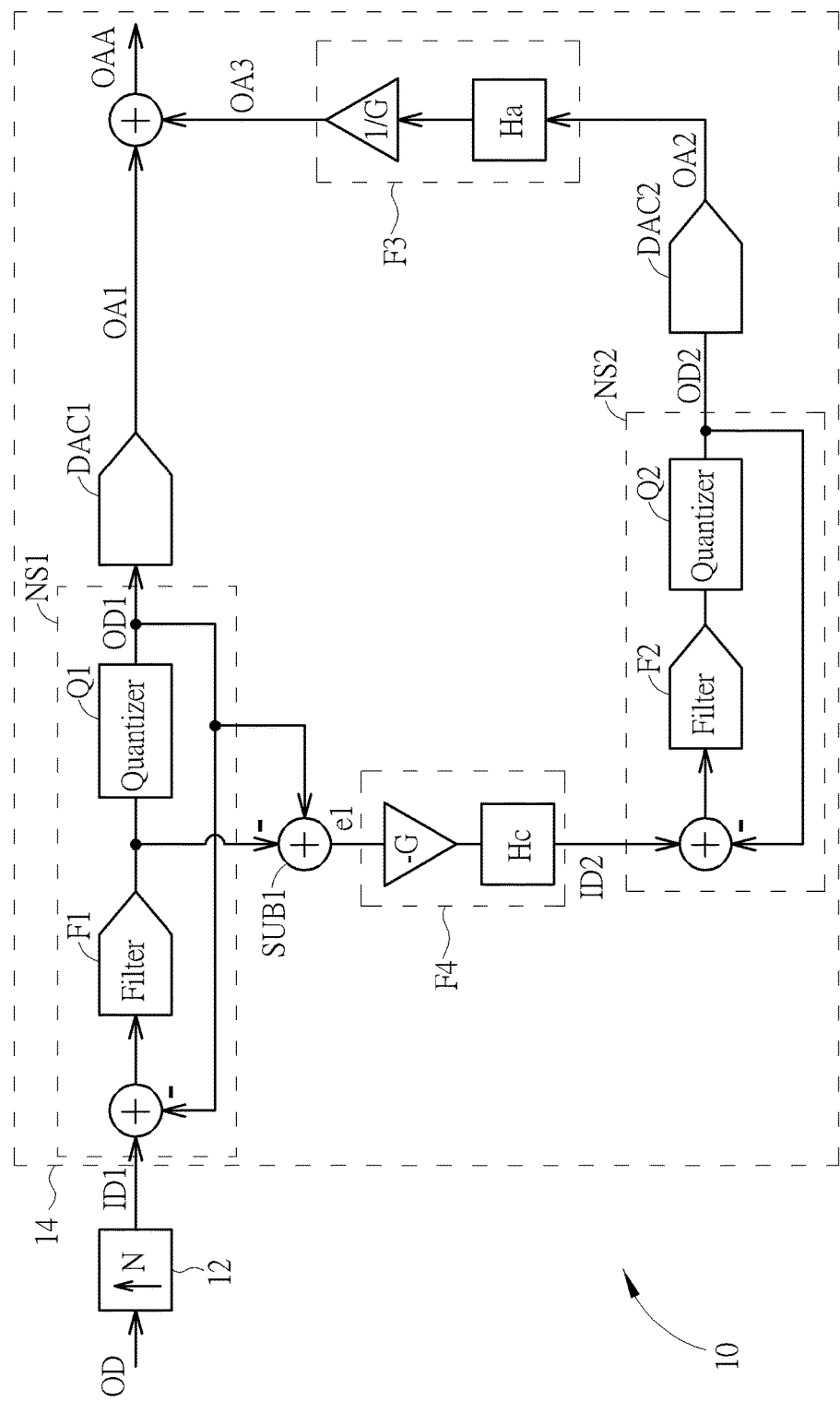
FIG. 1 is a schematic diagram of a sigma-delta (ΣΔ) digital-to-analog convertor (DAC) according to an embodiment of the present application.

Please refer to FIG. 1, which is a schematic diagram of a sigma-delta (ΣΔ) digital-to-analog convertor (DAC) according to an embodiment of the present application. The sigma-delta DAC 10 is an oversampling sigma-delta DAC. The sigma-delta DAC 10, configured to convert a digital signal OD as an overall analog output signal OAA, comprises an upsampling circuit 12 and a noise shaping circuit 14. The upsampling circuit 12 is configured to perform upsampling operation on the digital signal OD and generate a digital input signal ID1. The noise shaping circuit 14 comprises modulation units NS1 and NS2, digital-to-analog convertors DAC1 and DAC2, a subtractor SUB1 and filters F3, F4. The modulation unit NS1, coupled to the upsampling circuit 12, is configured to receive the digital input signal ID1 and generate a digital output signal OD1. The modulation unit NS1 comprises a filter F1 and a quantizer Q1. The quantizer Q1 is coupled to the filter F1, and the filter F1 has a transfer function H1. The subtractor SUB1, coupled to an input terminal and an output terminal of the quantizer Q1, is configured to generate a quantization noise e1 corresponding to the quantizer Q1. The modulation unit NS2, coupled to the subtractor SUB1, is configured to generate a digital output signal OD2 according to a digital input signal ID2, where the digital input signal ID2 is related to the quantization noise e1. In addition, the modulation unit NS2 comprises a filter F2 and a quantizer Q2. The quantizer Q2 is coupled to the filter F2, and the filter F2 has a transfer function H2. The noise shaping circuit 14 generates the overall analog output signal OAA according to the digital output signal OD1 and the digital output signal OD2. In addition, a first filter order of the filter F1 may be larger than or equal to a second filter order of the filter F2. In an embodiment, the filter F1 may be a second order filter. The transfer function H1 of the filter F1 may be represented as $H1(z)=z^{-1}/(1-z^{-1})^2$. Preferably, the filter F2 may be a first order filter. The transfer function H2 of the filter F2 may be represented as $H2(z)=z-1/(1-z^{-1})$.

The filter F3 is an analog filter with a direct current (DC) gain (i/G) and a transfer function Ha, where a value of the transfer function Ha corresponding to a DC frequency is 1. The filter F3, coupled to the modulation unit NS2, is configured to generate the filter result OA3. The noise shaping circuit 14 generates the overall analog output signal OAA according to the digital output signal OD1 and the filter result OA3. The DC gain (1/G) of the filter F3 is less than 1. In an embodiment, the filter F3 is a high pass filter (HPF) with a corner frequency Fc. In other words, the filter F3 would filter out signal of which frequency is less than the corner frequency Fc, and deliver signal of which frequency is larger than the corner frequency Fc.

The filter F4 is a digital filter with an inverting DC gain (−G) and a transfer function Hc. The filter F4, coupled to the subtractor SUB1, is configured to perform filtering operation on the quantization noise e1, to generate the digital input signal ID2. The filtering operation the filter F4 performs on the quantization noise e1 is equivalent to multiply the quantization noise e1 by the inverting gain (−G) and the transfer function Hc. Moreover, the transfer function Hc is related to the transfer function H1 of the filter F1 and the transfer function Ha of the filter F3. Preferably, the transfer function Hc is related to a reciprocal of the transfer function Ha. Regarding FIG. 1, the transfer functions Hc, H1 and Ha have a relationship of 1/(1+H1)=Hc*Ha in between. Specifically, the transfer function Hc may be represented as $Hc(z)=1/(1+H1(z))/Ha(s)|_{s\to z}$, where Hc(z) represents a function of the transfer function Hc in z-Domain, H1(z) represents a function of the transfer function H1 in z-Domain, Ha(s) represents a function of the transfer function Ha in s-Domain, and $Ha(s)|_{s\to z}$ represents a function of the transfer function Ha in z-Domain, i.e., $Ha(s)|_{s\to z}$ is the function converting Ha(s) from s-domain to z-domain. For illustrative purpose, the transfer function Hc may be simply represented as Hc=1/(1+H1)/Ha=1/[(1+H1)·Ha].

In addition, the digital-to-analog convertors DAC1 and DAC2 are coupled to the modulation units NS1 and NS2, configured to convert the digital output signals OD1 and OD2 as analog output signals OA1 and OA2, respectively. The filter F3, coupled to the digital-to-analog convertor DAC2, is configured to perform filtering operation on the analog output signal OA2. The filtering operation the filter F3 performs on the analog output signal OA2 is equivalent to multiply the analog output signal OA2 by the DC gain (1/G) and the transfer function Ha, to generate the filter result OA3. In the current embodiment, the noise shaping circuit 14 outputs the overall analog output signal OAA as a summation of the analog output signal OA1 and the filter result OA3.

Figure 2:
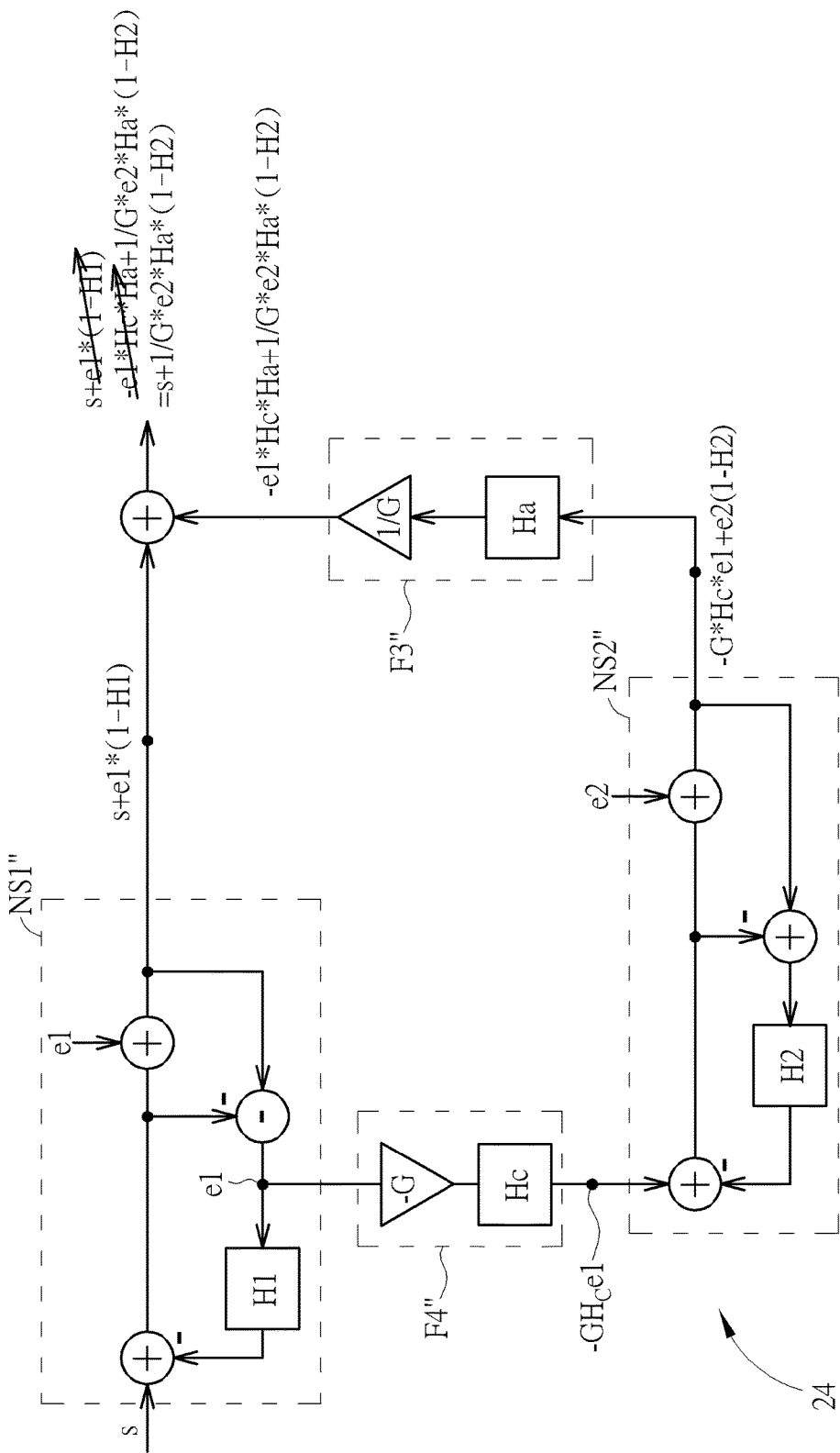
FIG. 2 is a schematic diagram of equivalent circuit model of a noise shaping circuit according to an embodiment of the present application.
Figure 3:
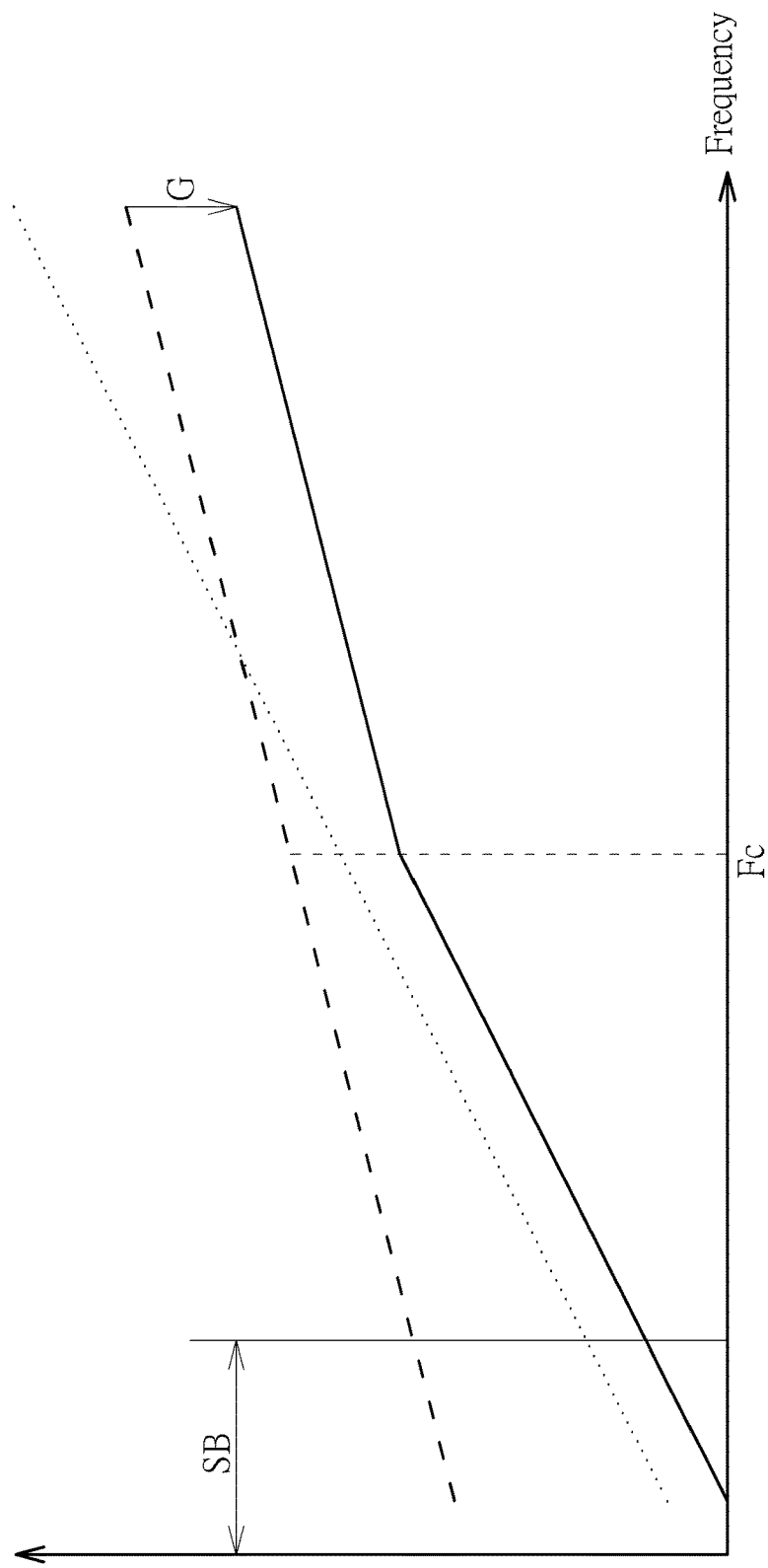
FIG. 3 is a schematic diagram of shaped noise spectrum.

In addition, please refer to FIG. 2 and FIG. 3. FIG. 2 is a schematic diagram of equivalent circuit model of another noise shaping circuit 24 according to an embodiment of the present application. FIG. 3 is a schematic diagram of shaped noise spectrum. The noise shaping circuit 24 comprises modulation units NS1" and NS2", and filters F3" and F4". In FIG. 2, s represents the digital input signal ID1, e1 represents the quantization noise brought by the quantizer Q1, e2 represents the quantization noise brought by the quantizer Q2. In FIG. 3, a dashed line represents a noise spectrum after a first order shaping, a dotted line represents a noise spectrum after a second order shaping, a solid line represents a noise spectrum of the noise shaped by the noise shaping circuit 24. For brevity, effect caused by the digital-to-analog convertor DAC1 and DAC2 on the noise shaping circuit 14 is ignored in the following description.

The modulation unit NS1" performs noise shaping on the quantization noise e1 after receiving the digital input signal ID1 (corresponding to the signal s). The signal outputted by the modulation unit NS1" may be represented as s+e1*(1−H1). In addition, the filter F4" performs filtering operation on the quantization noise e1. Hence, the signal outputted by the filter F4" may be represented as G·Hc·e1. The modulation unit NS2" receives the output signal G·Hc·e1 outputted by the filter F4" and performs noise shaping on the quantization noise e2. The signal outputted by the modulation unit NS2" may be represented as −G·Hc·e1+e2·(1−H2). The filter F3" performs filtering operation on the signal outputted by the modulation unit NS2". Since the transfer function Hc of the filter F4" and the transfer function Ha of the filter F3" have the relationship of Hc=(1−H1)/Ha and the DC gain of the filter F3" is (1/G), the components within the output signal outputted by the modulation unit NS1" related to the quantization noise e1 can be cancelled by the components within the output signal outputted by the modulation unit NS2" related to the quantization noise e1. Therefore, the signal outputted by the noise shaping circuit 24 (corresponding to the overall analog output signal OAA) may be represented as s+e1·(1−H1)−e1·Hc*Ha+(1/G)e2·Ha·(1−H2)=s+(1/G)e2·Ha·(1−H2).

Notably, within the signal outputted by the noise shaping circuit 24, the signal component related to the quantization noise is (1/G)e2·Ha·H2, where the filter F2" may be a first order filter. The transfer function H2 may be represented as $H2(z)=z^{-1}$. In an embodiment, the filter F3" may be a first order high pass filter within the corner frequency Fc. In other words, when frequency is less than the corner frequency Fc, the transfer function Ha is approximately in a first order attenuation; when frequency is larger than the corner frequency Fc, the transfer function Ha is 1. In such a situation, when frequency is less than the corner frequency Fc, the filter F2 is a first order filter and the transfer function Ha would apply a first order attenuation on the signal e2·H2. Thus, the noise shaping circuit 24 would perform a second order noise shaping on the quantization noise. On the other hand, when the frequency is larger than the corner frequency Fc, the transfer function Ha is 1 and the filter F2 is still a first order filter. Thus, the noise shaping circuit 24 would perform a first order noise shaping on the quantization noise. In other words, the noise shaping circuit 24 utilizes the inverting DC gain (−G) of the filter F4 to replace the quantization noise e1 brought by the modulation unit NS1"(i.e., e1·(1−H1)) with the quantization noise e2 brought by the modulation unit NS2" (i.e., (1/G)e2·Ha·(1−H2)). Since the quantization noise e2 is processed by the filters F2' and F3' via the transfer functions H2 and Ha, the shaped noise spectrum would be the spectrum illustrated as the solid line in FIG. 3.

Figure 4:
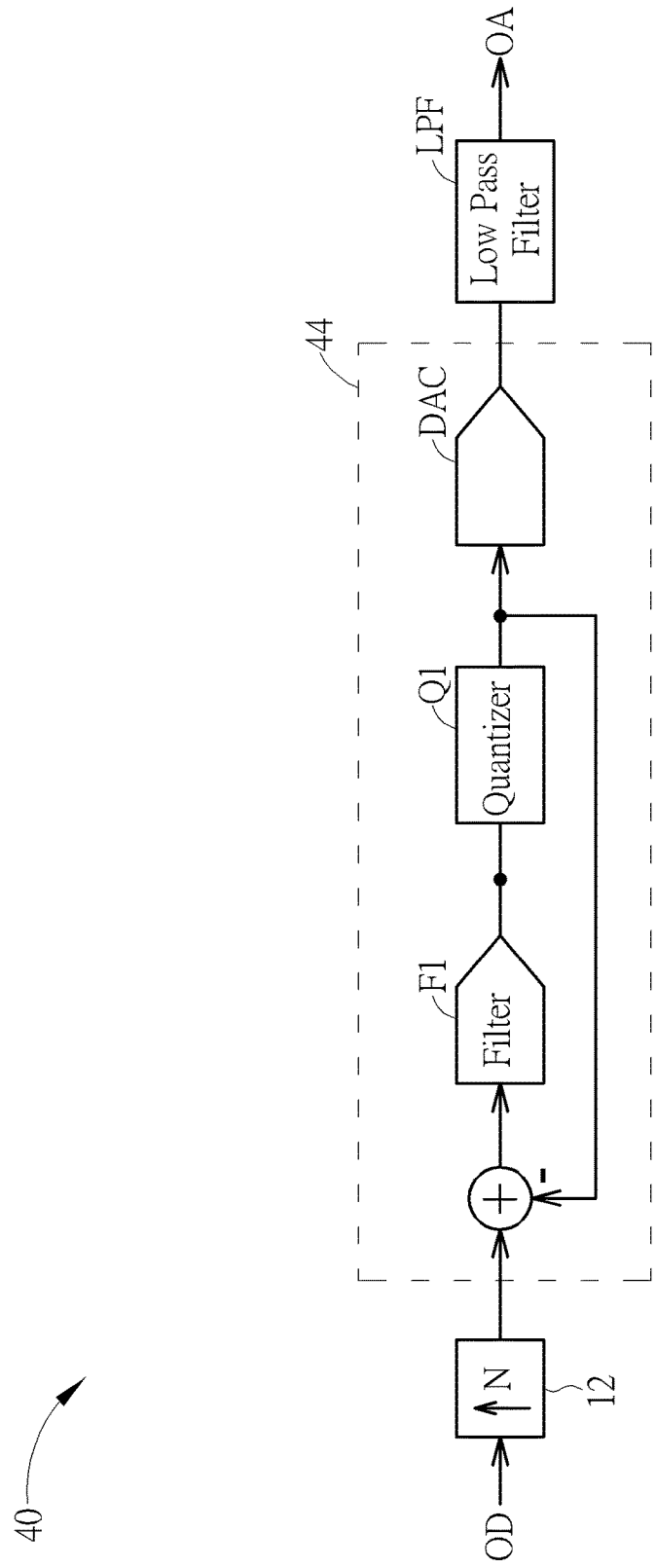
FIG. 4 is a schematic diagram of an oversampling sigma-delta DAC in the art.

In comparison, please refer to FIG. 4, which is a schematic diagram of an oversampling sigma-delta DAC 40 in the art. The oversampling sigma-delta DAC 40 comprises the noise shaping circuit 44, and the noise shaping circuit 44 comprises a filter F. When the filter F is a second order filter, the noise spectrum shaped by the noise shaping circuit 44 is the dotted line in FIG. 3 and a slope of the noise spectrum is larger. Advantage of the filter F being the second order filter is that the noise energy is low within a signal band SB, but disadvantage thereof is that the noise energy is too large at high frequency. When the filter F is a first order filter, the noise spectrum shaped by the noise shaping circuit 44 is the dashed line in FIG. 3 and a slope of the noise spectrum is smaller. Advantage of the filter F being the first order filter is that the noise energy is lower at high frequency, but disadvantage thereof is that the noise energy is larger within the signal band SB.

Notably, the noise spectrum shaped by the noise shaping circuit 24 has the property of the second order noise shaping within the signal band SB (i.e., lower noise energy within the signal band SB), and also has the property of the first order noise shaping outside the signal band SB or even at high frequency, (i.e., lower noise energy at high frequency). In other words, the noise shaping circuit 24 may own advantages of both the first order noise shaping and the second order noise shaping, which means that the noise spectrum shaped by the noise shaping circuit 24 has low noise energy both within the signal band SB and at high frequency. Furthermore, the filter F3 has the DC gain (1/G) and the DC gain (1/G) is less than 1. After the noise spectrum shaped by the noise shaping circuit 24 (corresponding to the solid line in FIG. 3) is further shifted downward by a factor G, compared to the noise spectrum by the first order shaping (corresponding to the dashed line in FIG. 3), where the noise energy is further reduced.

Figure 5:
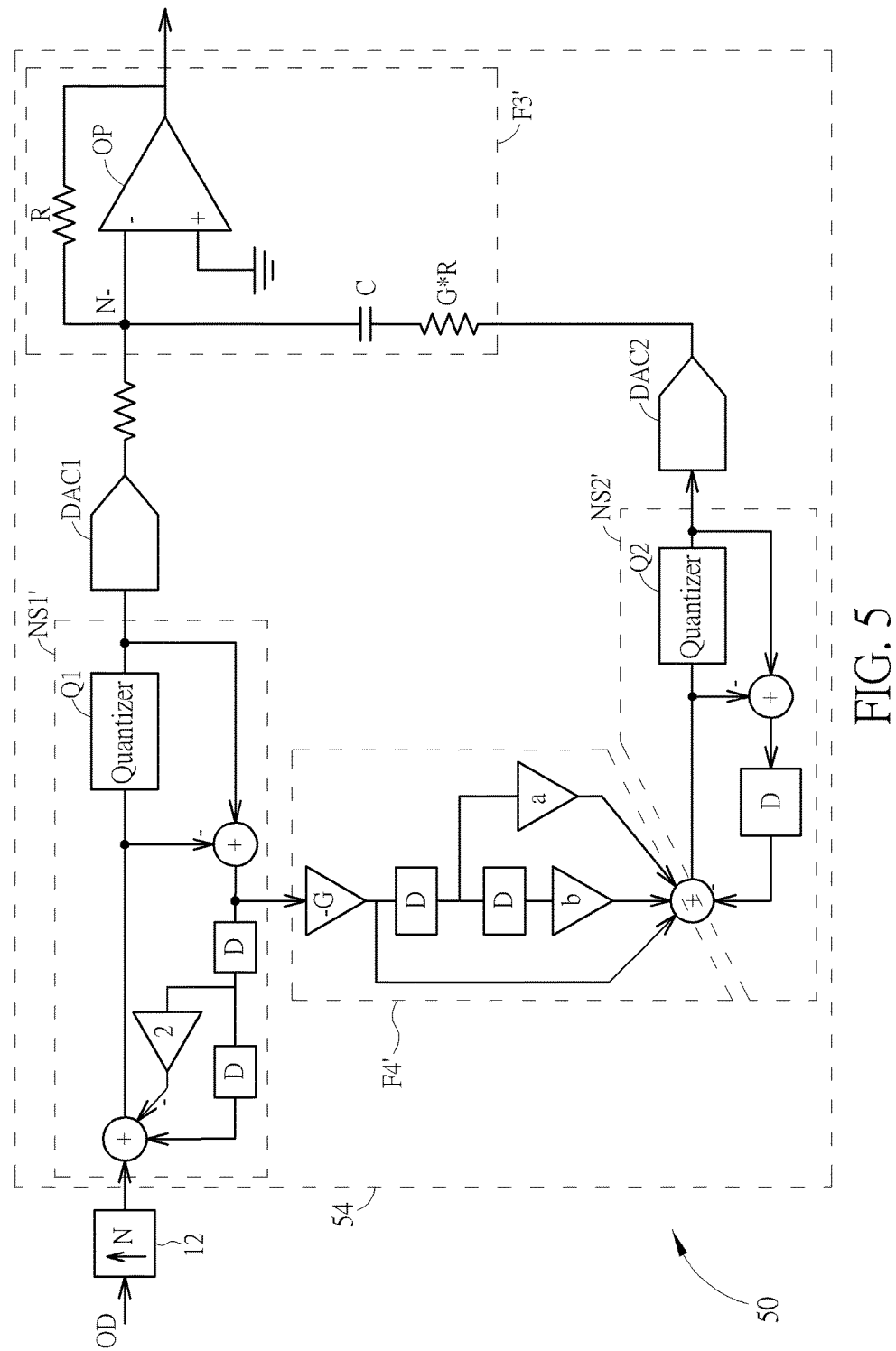
FIG. 5 is a schematic diagram of a sigma-delta DAC according to an embodiment of the present application.

In addition, the noise shaping circuit 14 in FIG. 1 is not limited to be realized by certain circuit structure. For example, please refer to FIG. 5, which is a schematic diagram of a sigma-delta DAC 50 according to an embodiment of the present application. The sigma-delta DAC 50 comprises a noise shaping circuit 54, and the noise shaping circuit 54 comprises modulation units NS1' and NS2', and filters F3' and F4'. The modulation units NS1' and NS2' and the filters F3' and F4' are configured to realize the modulation units NS1 and NS2 and the filters F3 and F4 of the noise shaping circuit 14 in FIG. 1, respectively. Operational principle of the noise shaping circuit 54 is the same as which of the noise shaping circuit 14, which is not narrated herein for brevity. Notably, the filter F3' is an analog high pass first order filter, which comprises the operational amplifier OP, a capacitor C, a resistor R and a resistor G*R, where a resistance of the resistor G*R is G times a resistance of the resistor R. The resistor R is coupled between a negative input terminal (denoted by "−") and an output terminal of the operational amplifier OP. The resistor R and the resistor G*R are coupled between the negative input terminal of the operational amplifier OP and the output terminal of the digital-to-analog convertor DAC2. In addition, since the resistance of the resistor G*R is G times the resistance of the resistor R, the DC gain of the filter F3' is (1/G), such that the noise spectrum shaped by the noise shaping circuit 54 is able to be shifted downward by the factor G. Furthermore, the corner frequency Fc of the filter F3' may be represented as 1/(2πGRC). When G is sufficiently large, the capacitance of the capacitor C is not required to be large to maintain the corner frequency Fc to be a specific value. In other words, the noise shaping circuit 54 does not need the capacitor C with large capacitance, which means that the circuit area is reduced.

As can be seen, the noise shaping circuit 24 utilizes the subtractor to capture the quantization noise e1 corresponding to the quantizer Q1; utilizes the filters F3" and F4" to recover the signal component related to the quantization noise e1 within the signal outputted by the modulation unit NS2" as e1·(1−H1), so as to cancel the signal component related to the quantization noise e1 within the signal outputted by the modulation unit NS1"; utilizes the filters F2" and F3" to shape the quantization noise e2 to be the spectrum illustrated as the solid line in FIG. 3; and utilizes the resistor G*R to lower the noise spectrum, increase signal-to-noise ratio (SNR), and reduce circuit area.

Notably, the embodiments stated in the above are utilized for illustrating the concept of the present application. Those skilled in the art may make modifications and alterations accordingly, and not limited herein. For example, the filter F1 is not limited to be a second order filter. The filter F1 may be a filter with even higher order, which is also within the scope of the present application.

In summary, the present application utilizes the two modulation units and the analog high pass filter to form the shaped noise spectrum with various slopes, which incorporates properties of both low order noise shaped spectrum and high order noise shaped spectrum. The present application has advantage of being able to lower the noise spectrum, increase SNR and reduce circuit area.

The foregoing is only embodiments of the present application, which is not intended to limit the present application. Any modification following the spirit and principle of the present application, equivalent substitutions, improvements should be included within the scope of the present invention.

What is claimed is:

1. A noise shaping circuit, comprising:
   a first modulation unit, configured to generate a first digital output signal according to a first digital input signal, the first modulation unit comprising:
     a first filter, having a first transfer function; and
     a first quantizer, coupled to the first filter;
   a first subtractor, coupled to an input terminal and an output terminal of the first quantizer, configured to generate a first quantization noise;
   a second modulation unit, configured to generated a second digital output signal according to a second digital input signal, wherein the second digital input signal is related to the first quantization noise, and the second modulation unit comprises:
     a second filter, having a second transfer function; and
     a second quantizer, coupled to the second filter;
   an adder, coupled to the first modulation unit, configured to generate an overall analog output signal;
   a third filter, having a third transfer function, coupled between the adder and the second modulation unit, configured to generate a filter result according to the second digital output signal; and
   a fourth filter, having a fourth transfer function, coupled between the first subtractor and the second modulation unit, configured to generate the second digital input signal according to the first quantization noise;
   wherein the overall analog output signal is related to a summation of the filter result and the first digital output signal;
   wherein the fourth transfer function is related to a reciprocal of the third transfer function.

2. The noise shaping circuit as claim 1, wherein the fourth filter has an inverting direct current (DC) gain.

3. The noise shaping circuit as claim 1, wherein the third filter has a DC gain, and the DC gain is less than 1.

4. The noise shaping circuit as claim 3, wherein the third filter comprises:
   an operational amplifier, comprising a first input terminal and an output terminal;
   a first resistor, coupled between the first input terminal and the output terminal of the operational amplifier, corresponding to a first resistance;
   a capacitor; and
   a second resistor, corresponding to a second resistance;
   wherein the capacitor and the second resistor are coupled between the first input terminal of the operational amplifier and the second modulation unit, the second resistance is the first resistance times a number, and the number is a reciprocal of the DC gain of the third filter.

5. The noise shaping circuit as claim 1, wherein the third filter is a high pass filter.

6. The noise shaping circuit as claim 1, further comprising:
   a first digital-to-analog convertor (DAC), coupled to the first modulation unit, configured to convert the first digital output signal as a first analog output signal; and
   a second DAC, coupled between the second modulation unit and the third filter, configured to convert the second digital output signal as a second analog output signal;
   wherein the third filter generates the filter result according to the second analog output signal;
   wherein the noise shaping circuit outputs the overall analog output signal as a summation of the first analog output signal and the filter result.

7. The noise shaping circuit as claim 1, wherein a first filter order of the first filter is larger than or equal to a second filter order of the second filter.

8. A sigma-delta digital-to-analog convertor, comprising:
   an upsampling circuit, configured to generate a first digital input signal; and
   a noise shaping circuit, wherein the noise shaping circuit comprising
     a first modulation unit, configured to generate a first digital output signal according to a first digital input signal, the first modulation unit comprising:
       a first filter, having a first transfer function; and
       a first quantizer, coupled to the first filter;
     a first subtractor, coupled to an input terminal and an output terminal of the first quantizer, configured to generate a first quantization noise;
     a second modulation unit, configured to generated a second digital output signal according to a second digital input signal, wherein the second digital input signal is related to the first quantization noise, and the second modulation unit comprises:
       a second filter, having a second transfer function; and
       a second quantizer, coupled to the second filter;
     an adder, coupled to the first modulation unit, configured to generate an overall analog output signal;
     a third filter, having a third transfer function, coupled between the adder and the second modulation unit, configured to generate a filter result according to the second digital output signal; and
     a fourth filter, having a fourth transfer function, coupled between the first subtractor and the second modulation unit, configured to generate the second digital input signal according to the first quantization noise;
     wherein the overall analog output signal is related to a summation of the filter result and the first digital output signal;
     wherein the fourth transfer function is related to a reciprocal of the third transfer function.

* * * * *